United States Patent
Wang et al.

(10) Patent No.: US 7,943,948 B2
(45) Date of Patent: May 17, 2011

(54) HIGH EFFICIENT PHOSPHOR-CONVERTED LIGHT EMITTING DIODE

(75) Inventors: Chien-Yuan Wang, Hsinchu (TW);
Chih-Chiang Lu, Hsinchu (TW);
Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 12/764,436

(22) Filed: Apr. 21, 2010

(65) Prior Publication Data

US 2010/0200873 A1    Aug. 12, 2010

Related U.S. Application Data

(63) Continuation of application No. 11/822,181, filed on Jul. 3, 2007, now Pat. No. 7,732,827.

(30) Foreign Application Priority Data

Jul. 4, 2006   (TW) .............................. 95124433 A

(51) Int. Cl.
*H01L 33/00* (2010.01)
*H01L 21/00* (2006.01)

(52) U.S. Cl. ............................................ 257/98; 438/29
(58) Field of Classification Search .............. 257/10–13, 257/79–106, E33.001–E33.077, E51.018–E51.022; 438/22–35

See application file for complete search history.

(56) References Cited

U.S. PATENT DOCUMENTS

| | | | |
|---|---|---|---|
| 7,732,827 B2 * | 6/2010 | Wang et al. | ...................... 257/98 |
| 2004/0119083 A1 | 6/2004 | Su et al. | |
| 2006/0145172 A1 | 7/2006 | Su et al. | |
| 2006/0152150 A1 | 7/2006 | Boerner et al. | |
| 2006/0158103 A1 | 7/2006 | Katano et al. | |
| 2006/0255713 A1 | 11/2006 | Kondo et al. | |
| 2010/0200873 A1 * | 8/2010 | Wang et al. | ...................... 257/89 |

* cited by examiner

*Primary Examiner* — Calvin Lee
(74) *Attorney, Agent, or Firm* — Bacon & Thomas, PLLC

(57) ABSTRACT

A light-emitting device and manufacturing method thereof are disclosed. The light-emitting device includes a substrate, a semiconductor light-emitting structure, a filter layer, and a fluorescent conversion layer. The method comprises forming a semiconductor light-emitting structure over a substrate, forming a filter layer over the semiconductor light-emitting structure, and forming a fluorescent conversion layer over the filter layer.

20 Claims, 2 Drawing Sheets

HIGH EFFICIENT PHOSPHOR-CONVERTED LIGHT EMITTING DIODE

CROSS REFERENCE TO RELATED APPLICATIONS

This application is a continuation application of co-pending U.S. application Ser. No. 11/822,181, filed Jul. 3, 2007, and for which priority is claimed under 35 USC §120 of which the entire disclosure of the pending, prior application is hereby incorporated by reference, and claims the right of priority of Taiwan Patent Application No. 095124433 filed on Jul. 5, 2006.

TECHNICAL FIELD

This present disclosure relates to a light-emitting device and a method of forming the same, especially has a filter layer and a fluorescent conversion layer.

BACKGROUND OF THE DISCLOSURE

The white light LED (Light-emitting diode, LED) technology can be divided into single-chip type and multiple-chips type. The multiple-chips type using LEDs of three colors to mix the light emitted respectively into the white light. The benefit of the multiple-chips type is the flexibility of the light mixing based on different visual demand. However, the cost is relatively high for using many of LEDs chips at the same time. Furthermore, because the materials of making the LEDs with various colors are different, which needs different forward voltage (Vf) of the input, three sets of control circuit are needed. In addition, the speed of decay, the temperature characteristics and the life-time of the three kinds of LED chips are not the same, so the color of the white light is not stable and changes with time.

For single-chip type, there are three ways to manufacture the commercialized white light LED: 1. Blue LED chips combine with the yellow phosphor: The yellow phosphor used mainly is YAG phosphor of the yttrium aluminum garnet structure. The yellow light converted by the phosphor mixed with the unabsorbed blue light emitted from the blue LED can generate the white light. 2. Blue LED chips combine with the red and green phosphors: The phosphor used here is mainly containing sulfur. The red and green lights from the phosphor are combined with the unabsorbed blue light, and a white light is generated. 3. Ultraviolet LED chips combine with the red, blue and green phosphors: The ultraviolet light generated by the UV LED chips excites three or more kinds of phosphors which can respectively generates the light of red, blue and green at the same time, and the mixture of the lights mentioned above can generate the white light. To manufacture the above-mentioned devices, the phosphor and silicone is disposed into a concave after being mixed. However, it is difficult to mix the phosphor and silicone uniformly. As a result, the color temperature is uneven. When the light enters the phosphor-silicone layer from the LED, a high proportion (for example greater than 30%) of light can be back-scattered into the chips by the phosphor. Therefore, the light utilization efficiency is reduced.

U.S. Pat. No. 6,642,652 disclosed a flip-chip semiconductor light-emitting device covered by the phosphor structure formed by electrophoresis. But the method is difficult to distribute the powder uniformly in chip scale by controlling the electric field distribution and the electric charged state of the inorganic powder body, especially in the chip sidewall.

SUMMARY OF THE DISCLOSURE

This disclosure disclosed a light-emitting device and a method of forming the same. A phosphor layer is formed on the chip before encapsulation in order to avoid the disadvantage of above-mentioned known technology. Another purpose of the disclosure is to form a filter layer between LED and a fluorescent conversion layer to reduce the light luminescence efficiency loss from the LED and phosphor material stacking structure, and to improve the overall light luminescence efficiency of the device.

The light-emitting device of this disclosure includes a semiconductor structure with an active layer over a substrate, which can emit the first wavelength light; a fluorescent conversion layer over the semiconductor structure, which can absorb the first wavelength light emitted form the active layer of the semiconductor structure and can transfer the light into a second wavelength light; and a filter layer between the semiconductor structure and the fluorescent conversion layer, which has a light transmissivity of more than 50% to the first wavelength light and has a light reflectivity of more than 50% to the second wavelength light. Therefore, it can reduce the light luminescence efficiency loss caused by the absorption of the light which is back-scattered into the chip again during the transforming of the first wavelength light to the second wavelength light.

The filter layer of the light-emitting device of this disclosure is formed by one kind of material, or stacking or mixing two or more kind of materials. Such material has wavelength selectivity, which has a light transmissivity of more than 90% and lower light reflectivity to the ultraviolet light, or has a light transmissivity of lower than 5% and higher light reflectivity to the visible light.

BRIEF DESCRIPTION OF THE DRAWINGS

The foregoing aspects and many of the attendant advantages of this disclosure are more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
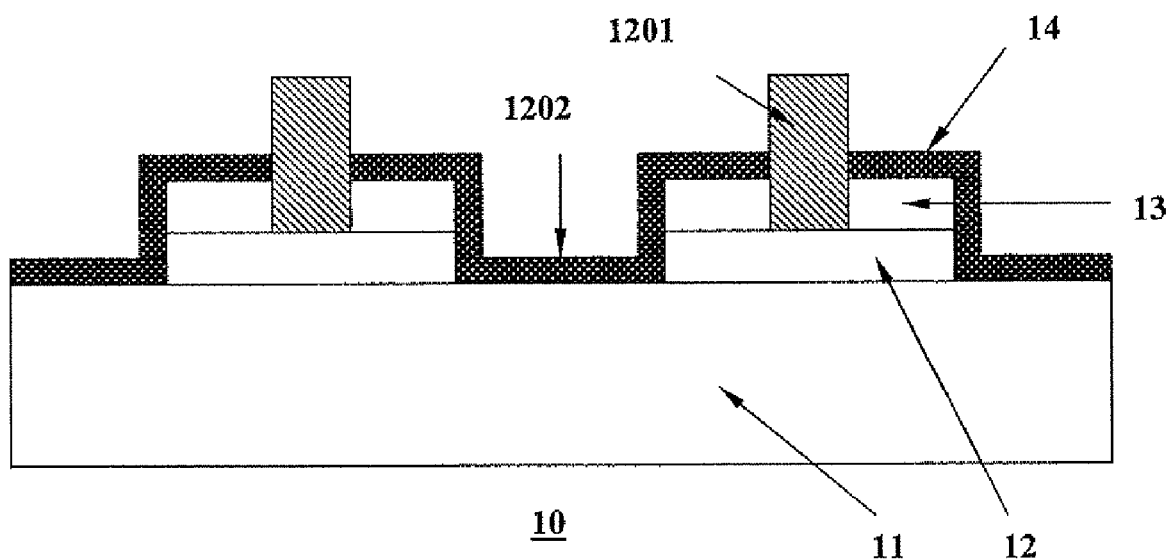
FIG. 1 is a schematic view of the first embodiment of the present disclosure.

FIG. 1 shows a schematic view of the preferred embodiment of the present disclosure. The disclosure discloses a light-emitting device 10 comprising a substrate 11, a semiconductor layer 12 having an active layer to emit a first wavelength light, a filter layer 13 and a fluorescent conversion layer 14. The material of the substrate 11 is composed of either opaque material or transparent material. For opaque material, it can be semiconductor metal or other opaque materials. In a preferred embodiment, the material of the substrate is selected from the group of Si, GaN/Si, GaAs and the combination of the above materials. For transparent materials, it can be glass, sapphire, SiC, GaP, GaAsP, ZnSe, ZnS or ZnSSe. The structure of the semiconductor structure 12 is either vertical (the electrical contacts located on the different side of the structure) or horizontal (the electrical contacts located on the same side of the structure). When the first wavelength light passes the filter layer 13 and enters the fluorescent conversion layer 14, it is absorbed and converted into a second wavelength light. The unabsorbed first wavelength light is mixed with the second wavelength light and a white light is generated consequently.

In addition, as FIG. 1 shows, more than two semiconductor structures 12 are formed by forming a trench 1202 on the substrate, and then a plurality of chips are formed by dicing process. The dicing process can also be performed after forming the filter layer 13 and the fluorescent conversion layer 14.

Figure 2:
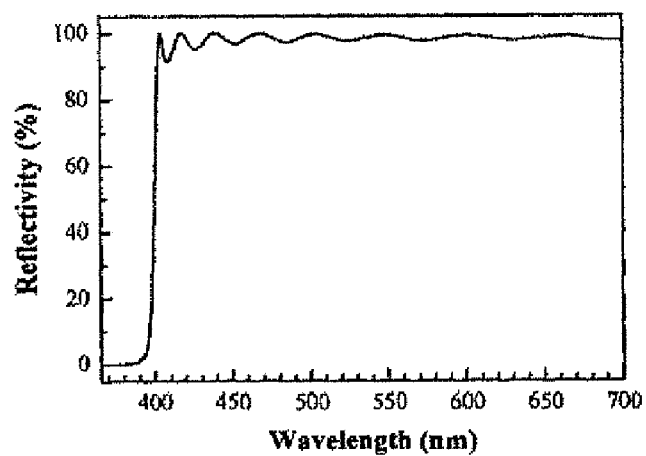
FIG. 2 is a reflectivity spectrum of the filter layer that is made by $TiO_2$ and $SiO_2$ in the first embodiment of the present disclosure.

A filter layer 13 is stacked by at least two materials with different refractive indexes and is formed on the semiconductor structure 12 by deposition process. The average light reflectivity is greater than 90% to the visible light. A preferred selection of the combination of the at least two materials with different refractive indexes is a higher refractive material with a refractive index of 2.1 to 2.6, such as $TiO_2$, $Nb_2O_5$ or $Ta_2O_5$, and a lower refractive material with a refractive index of 1.2 to 1.6, such as $SiO_2$ or $MgF_2$. The thickness of the filter layer is in the range from several tens of angstroms to several tens of micrometers, depending on the material characteristic. The filter layer can almost allow the whole transmission of the ultraviolet light. FIG. 2 shows a reflectivity spectrum of the filter layer that is made by TiO2 and SiO2.

A fluorescent conversion layer 14 is formed on the filter layer 13, and its forming method comprises the following steps:

(1) Surface modification of the fluorescent conversion material: Taking 0.3 gram of Yttrium Aluminum Garnet (YAG) phosphor and 5 ml of γ-3-glycidoxypropyldimethoxymethylsilane mixed with 30 ml of 95% (volume percentage) alcoholic solution. After heating the mixed solution to 70° C. and stirring for 2 hours, the powder in the solution is filtered out. Washing the powder with alcohol and drying it at 85° C., then a surface modified of the YAG phosphor.

(2) Formation of the fluorescent conversion material: Mixing the surface modified the YAG phosphor with the Isopropanol, then pouring them into the container with a wafer inside, waiting for the YAG phosphor powder deposited on the wafer surface by the gravity and leaving the upper solution clear. Distilling most of the upper clear solution, and then put the container into the oven with a temperature of 120° C. to form the fluorescent conversion material by baking YAG phosphor.

(3) Protection of the fluorescent conversion material: To survive the following light-emitting device manufacturing processes, the fluorescent conversion material must be anticorrosive and have strong adhesion. Using the hardened resin with the low viscosity and the high impermeability of ultraviolet light to form a film on the surface of the YAG fluorescent conversion layer can protect the device effectively.

The substrate 11 and the semiconductor structure 12 are electrically connected and then are diced to produce the light-emitting diode chips having a filter layer and a fluorescent conversion layer.

Figure 3:
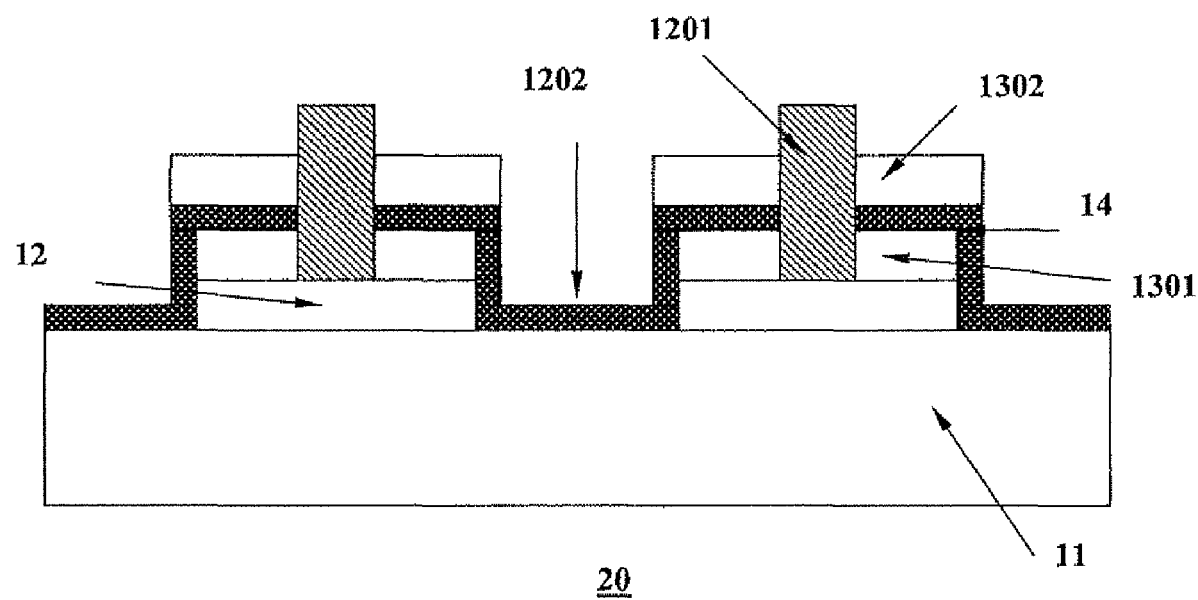
FIG. 3 is a schematic view of the second embodiment of the present disclosure.

FIG. 3 shows a schematic view of another preferred embodiment of the present disclosure. The numerals of the elements in this embodiment are the same as the elements in the first embodiment. The light-emitting device 20 structure and its manufacturing method are the same as the above-mentioned also. After forming the semiconductor structure 12 having an active layer, a first filter layer 1301 is then deposited on the active layer. Depositing a fluorescent conversion layer 14 on the first filter layer 1301, and depositing a second filter layer 1302 on the fluorescent conversion layer 14 finally. The first filter layer 1301 has a light transmissivity of more than 50% to the first wavelength light and a light reflectivity of more than 50% to the second wavelength light. The second filter layer 1302 has a light reflectivity of more than 50% to the first wavelength light and has a light transmissivity of more than 50% to the second wavelength light.

The first filter layer 1301 is stacked by at least two materials with different refractive indexes. The at least two materials can almost allow the whole transmission to the ultraviolet light, and the average reflectivity of the materials is above 90% to the visible light (400 nm≦λ≦700 nm). The second filter layer 1302 is stacked by at least two materials with different refractive indexes. The average reflectivity of the materials is near 100% to the ultraviolet light, and is very low (≦1%) to the visible light. A preferred selection of the combination of the at least two materials with different refractive indexes is a higher refractive material with a refractive index of 2.1 to 2.6, such as $TiO_2$, $Nb_2O_5$ or $Ta_2O_5$, and a lower refractive material with a refractive index of 1.2 to 1.6, such as $SiO_2$ or $MgF_2$. The thicknesses of the filter layers are in the range from several tens of angstroms to several tens of micrometers depending on the material characteristic.

Although specific embodiments have been illustrated and described, it will be apparent that various modifications may fall within the scope of the appended claims.

We claim:

1. A light-emitting device, comprising:
   a semiconductor structure emitting a first wavelength light;
   a conversion layer configured to emit a second wavelength light in response to the first wavelength light; and
   a downstream filter, on a path of the first wavelength light and a path of the second wavelength light, having a light transmissivity of more than 50% to the second wavelength light;
   wherein some of the first wavelength light is configured to pass through the conversion layer and mix with the second wavelength light to produce a white light.

2. The light-emitting device of claim 1, wherein the downstream filter has a light reflectivity of more than 50% to the first wavelength light.

3. The light-emitting device of claim 1, further comprising an upstream filter being struck by the first wavelength light before the downstream filter.

4. The light-emitting device of claim 1, further comprising an upstream filter being struck by the first wavelength light before the downstream filter and having a light reflectivity of more than 50% to the second wavelength light.

5. The light-emitting device of claim 1, further comprising an upstream filter being struck by the first wavelength light before the downstream filter and having a light transmissivity of more than 50% to the first wavelength light.

6. The light-emitting device of claim 1, wherein the first wavelength light is mixed with the second wavelength light after or before the downstream filter.

7. The light-emitting device of claim 1, wherein the first wavelength light is mixed with the second wavelength light after the conversion layer.

8. The light-emitting device of claim 1, wherein downstream filter comprises a lower refractive material and higher refractive material.

9. The light-emitting device of claim 1, wherein the conversion layer comprises a phosphor.

10. The light-emitting device of claim 1, further comprising an upstream filter separating the conversion layer from directly contacting the semiconductor structure and reflecting the second wavelength light that is moving toward the semiconductor structure.

11. A light-emitting device, comprising:
a semiconductor structure emitting a first wavelength light;
a conversion layer configured to emit a second wavelength light in response to the first wavelength light; and
a stacking structure, on a path of the first wavelength light or a path of the second wavelength light, comprising a lower refractive material and a higher refractive material, and having a light reflectivity of more than 50% to the first wavelength light or the second wavelength light;
wherein the first wavelength light is mixed with the second wavelength light before or after the conversion layer to produce a white light.

12. The light-emitting device of claim 11, wherein the lower refractive material has a refractive index of 1.2 to 1.6.

13. The light-emitting device of claim 11, wherein the higher refractive material has a refractive index of 2.1 to 2.6.

14. A light-emitting device, comprising:
a first semiconductor structure emitting a first wavelength light;
a conversion layer configured to emit a second wavelength light in response to the first wavelength light; and
an upstream filter or a downstream filter, on a path of the first wavelength light and a path of the second wavelength light, having a light reflectivity of more than 50% to the first wavelength light or the second wavelength light;
wherein the first wavelength light is mixed with the second wavelength light before or after the conversion layer to produce a white light.

15. The light-emitting device of claim 14, wherein the upstream filter is struck by the first wavelength light before the downstream filter and has a light transmissivity of more than 50% to the first wavelength light.

16. The light-emitting device of claim 14, wherein the downstream filter is struck by the first wavelength light after the downstream filter and has a light transmissivity of more than 50% to the second wavelength light.

17. The light-emitting device of claim 14, wherein the upstream filter or the down stream filter comprises a lower refractive material and a higher refractive material.

18. The light-emitting device of claim 14, wherein the conversion layer comprises a phosphor.

19. The light-emitting device of claim 14, further comprising a second semiconductor structure being separated from the first semiconductor structure by a trench.

20. The light-emitting device of claim 14, further comprising a second semiconductor structure being separated from the first semiconductor structure by a trench; wherein the conversion layer is overlaid on the first semiconductor structure and the second semiconductor structure.

* * * * *